United States Patent
Maa et al.

(10) Patent No.: US 7,786,469 B2
(45) Date of Patent: Aug. 31, 2010

(54) THERMAL SENSOR WITH A SILICON/GERMANIUM SUPERLATTICE STRUCTURE

(75) Inventors: Jer-Shen Maa, Vancouver, WA (US); Jinke Tang, New Orleans, LA (US); Jong-Jan Lee, Camas, WA (US); Douglas J. Tweet, Camas, WA (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 157 days.

(21) Appl. No.: 12/236,480

(22) Filed: Sep. 23, 2008

(65) Prior Publication Data

US 2009/0173933 A1 Jul. 9, 2009

Related U.S. Application Data

(62) Division of application No. 11/522,003, filed on Sep. 15, 2006, now Pat. No. 7,442,599.

(51) Int. Cl.
*H01L 31/00* (2006.01)
(52) U.S. Cl. .......... 257/19; 257/E21.035; 257/E33.009; 257/E31.043; 438/199; 438/54
(58) Field of Classification Search .................. 438/54, 438/199; 257/E21.035, E33.009, E31.043, 257/19
See application file for complete search history.

(56) References Cited

U.S. PATENT DOCUMENTS

| | | | | | |
|---|---|---|---|---|---|
| 5,461,250 | A | * | 10/1995 | Burghartz et al. | 257/347 |
| 5,834,333 | A | * | 11/1998 | Seefeldt et al. | 438/52 |
| 6,717,213 | B2 | * | 4/2004 | Doyle et al. | 257/347 |
| 7,101,773 | B2 | * | 9/2006 | Danel | 438/455 |
| 7,202,140 | B1 | * | 4/2007 | Ang et al. | 438/455 |
| 7,309,620 | B2 | * | 12/2007 | Fonash et al. | 438/53 |
| 2004/0106268 | A1 | * | 6/2004 | Shaheen et al. | 438/455 |
| 2004/0137698 | A1 | * | 7/2004 | Taraschi et al. | 438/458 |
| 2004/0217845 | A1 | * | 11/2004 | Silver et al. | 338/25 |
| 2005/0156268 | A1 | * | 7/2005 | Chu | 257/478 |
| 2006/0038301 | A1 | * | 2/2006 | Suzuki | 257/775 |
| 2006/0057820 | A1 | * | 3/2006 | Yamanaka | 438/458 |
| 2006/0194415 | A1 | * | 8/2006 | Lee et al. | 438/459 |

* cited by examiner

*Primary Examiner*—Fernando L Toledo
*Assistant Examiner*—Ankush K Singal
(74) *Attorney, Agent, or Firm*—Law Office of Gerald Maliszewski; Gerald Maliszewski

(57) ABSTRACT

A silicon/germanium (SiGe) superlattice thermal sensor is provided with a corresponding fabrication method. The method forms an active CMOS device in a first Si substrate, and a SiGe superlattice structure on a second Si-on-insulator (SOI) substrate. The first substrate is bonded to the second substrate, forming a bonded substrate. An electrical connection is formed between the SiGe superlattice structure and the CMOS device, and a cavity is formed between the SiGe superlattice structure and the bonded substrate.

9 Claims, 9 Drawing Sheets

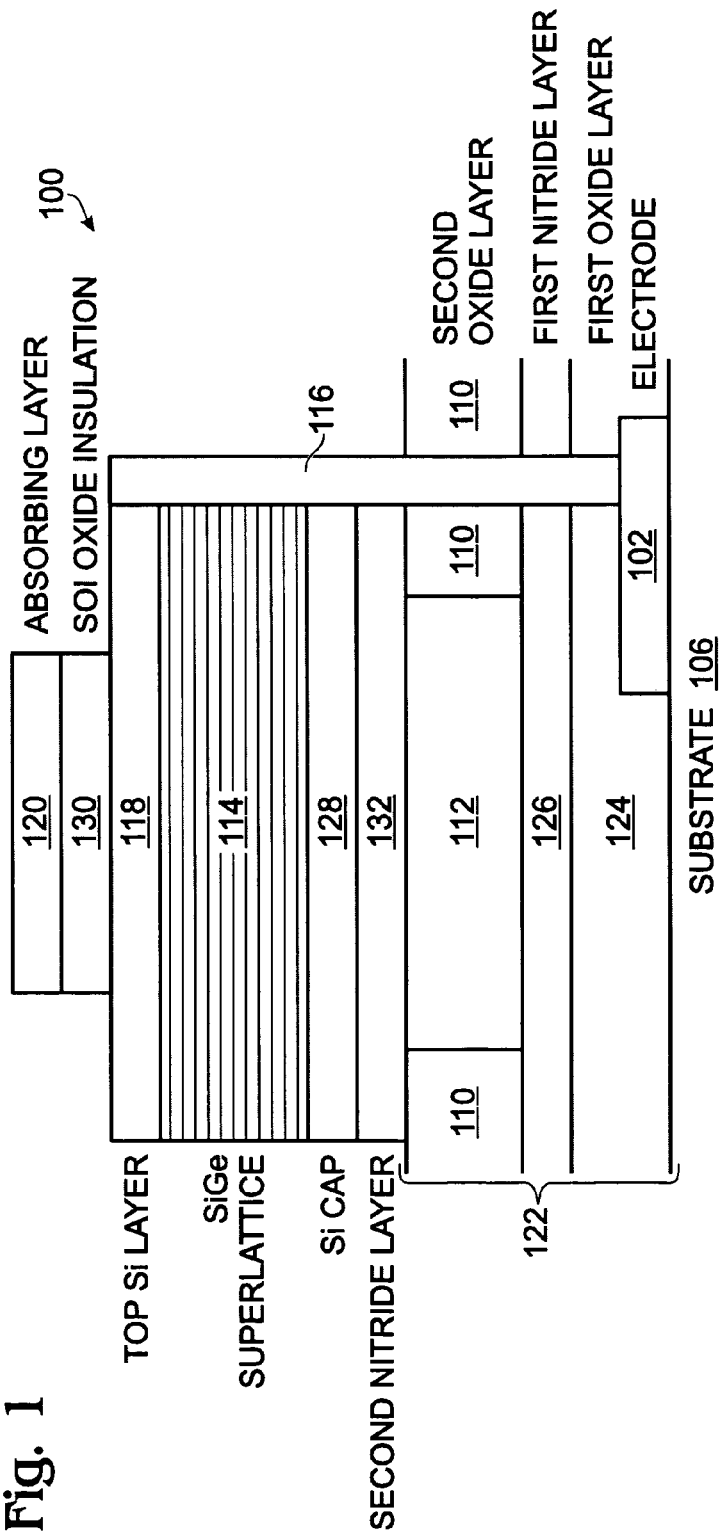
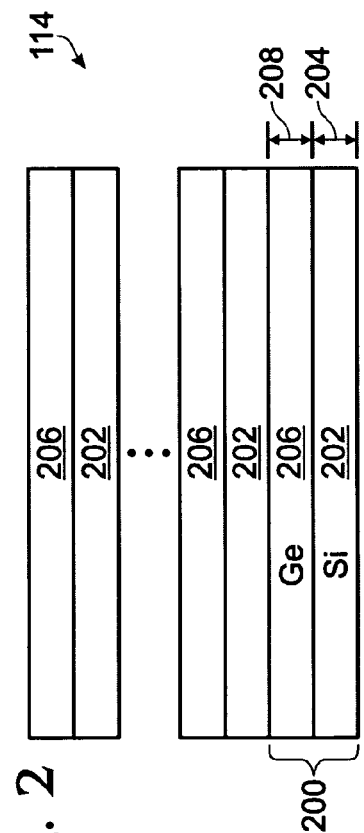

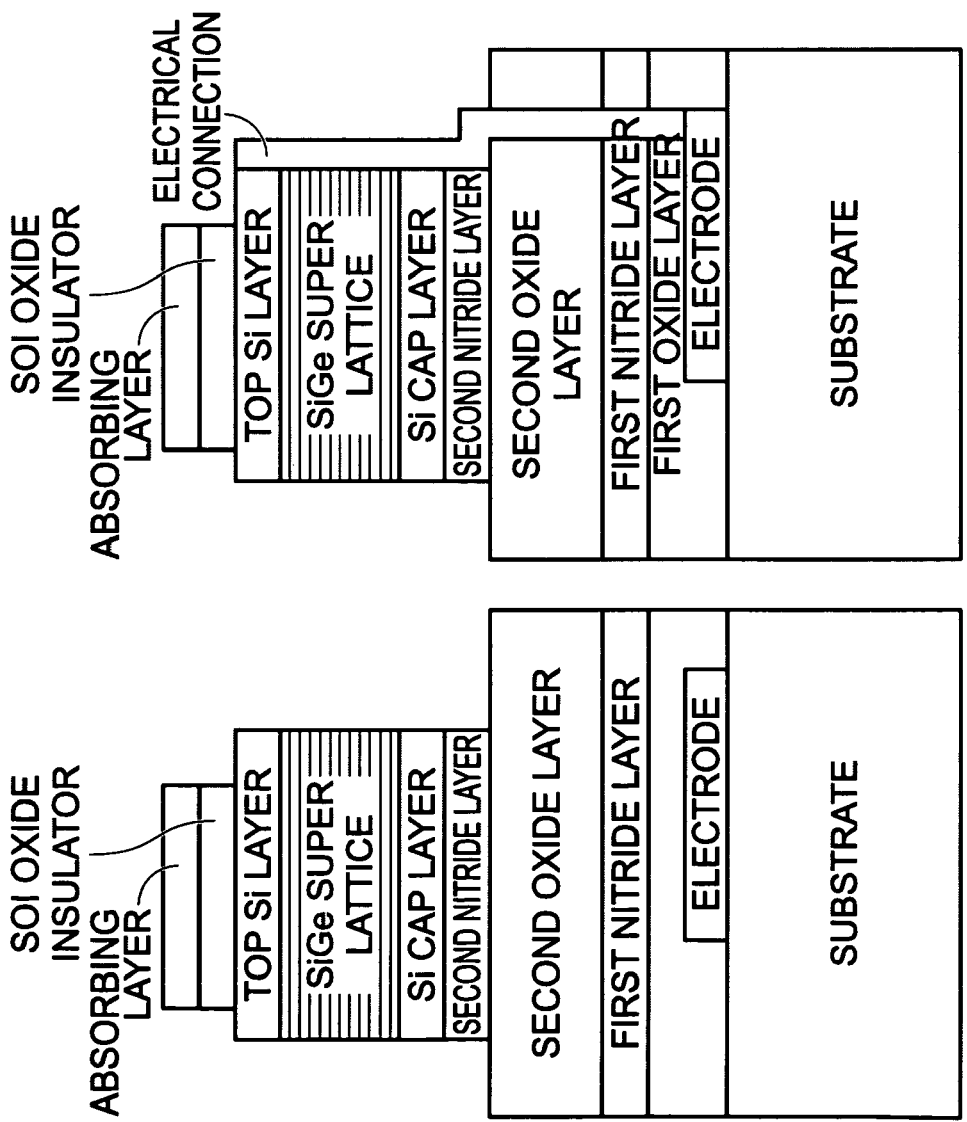

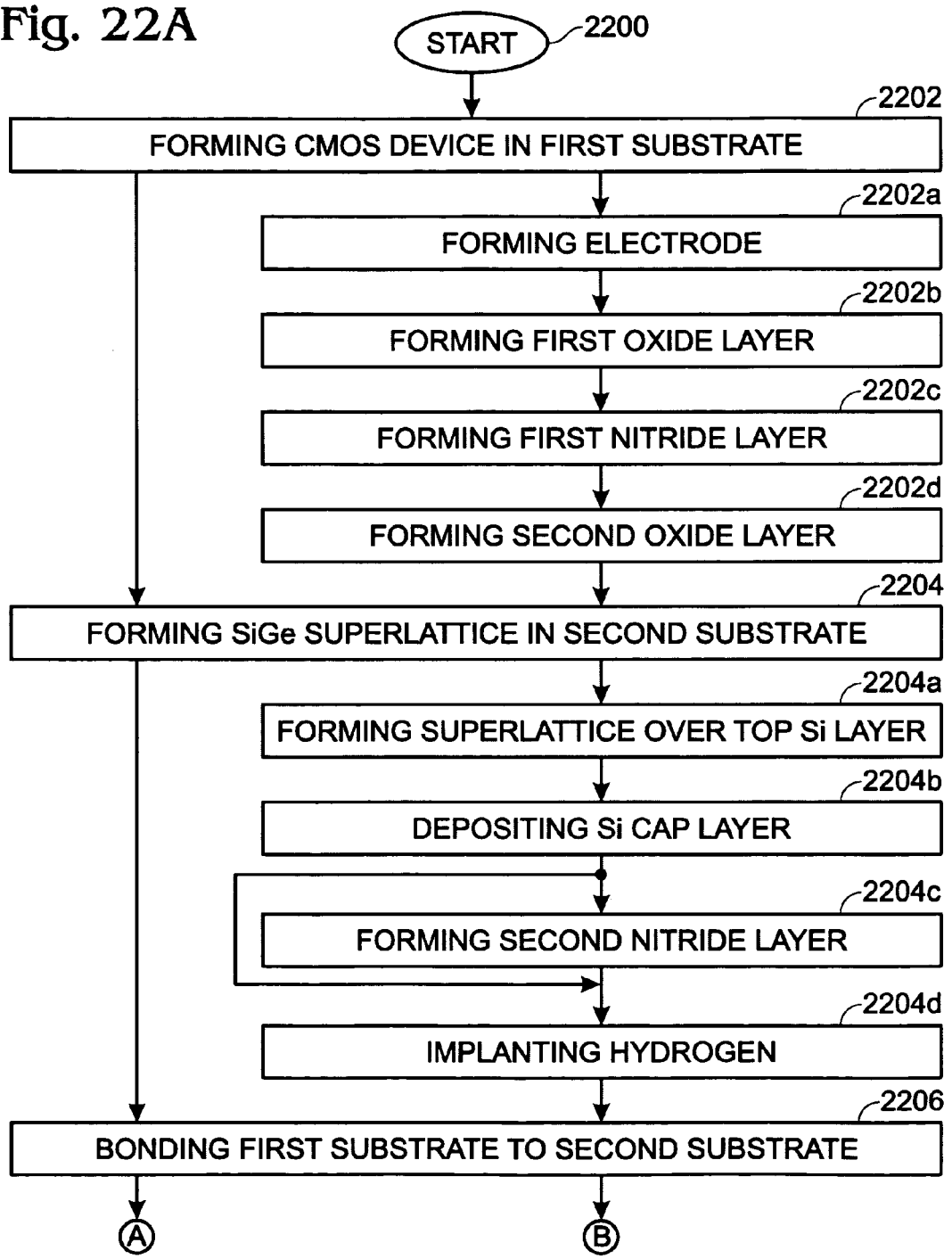

THERMAL SENSOR WITH A SILICON/GERMANIUM SUPERLATTICE STRUCTURE

RELATED APPLICATIONS

The application is a Divisional of an application entitled SILICON/GERMANIUM SUPERLATTICE THERMAL SENSOR, Jer-shen Maa et al., Ser. No. 11/522,003, filed on Sep. 15, 2006 now U.S. Pat. No. 7,442,599, which is incorporated herein by reference.

BACKGROUND OF THE INVENTION

1. Field of the Invention

This invention generally relates to integrated circuit fabrication and, more particularly, to a thermal sensor made with a silicon/germanium (Si/Ge) superlattice, and a corresponding fabrication process.

2. Description of the Related Art

In a thermal imager, the incident infrared (IR) light is detected by an induced increase in sensor temperature. A thermal sensor uses a material with a temperature-dependent resistance to measure this heating effect. Resistive materials with a high value of the temperature coefficient of resistance (TCR), such as vanadium oxide, have been used for this application. Other materials include metals such as titanium, platinum, nickel, niobium, nickel-iron, chromium, aluminum, etc., and semiconductor materials such as germanium, silicon/germanium, and amorphous silicon. These materials can be fabricated into microbridges, with cavities formed by micromachining underneath the microbridges, to increase thermal sensitivity. That is, the microbridge structures make the sensor more responsive to light-induced thermal changes.

Thin films of mixed vanadium oxides (VOx) can be used to fabricate a microbolometer with a two-level design that permits readout circuitry (ROIC) be placed in the Si substrate underneath the microbridge. Fabrication begins with implantation of the readout electronics and conducting metallizations in the Si wafer. For example, a MOSFET or diode is fabricated in the substrate to generate an electrical signal responsive to temperature. The wafer is then planarized with a material, such as spun-on polyimide, which can be photolithographically patterned to form sacrificial mesa. Silicon nitride layers are sputtered over the sacrificial mesas, together with TCR material and connecting metallizations. Then the sacrificial mesas are removed by a material-selective etch to leave a self-supporting two-level structure.

Although materials such as VOx has been used successfully in microbolometer thermal imager applications, the deposition of low-noise VOx material on foundry CMOS wafers is still a challenge. The optimum deposition process remains impractical due to the tight oxygen content control needed. Mass-market thermal imaging applications, such as automotive night vision for example, require a far lower-cost solution than can be achieved using VOx microbolometers.

Polycrystalline SiGe is a promising material because of its low thermal conductivity, high TCR, and moderate noise level, combined with a low stress suitable for surface micromachining. This choice of materials is benefited by the fact that SiGe is a CMOS front-end material used in BiCMOS and strained CMOS processes, and its process modules are available in IC foundries. However, the deposition of polycrystalline SiGe and the subsequent annealing requires a high temperature that is not compatible with conventional CMOS post-processes. Therefore, conventional polycrystalline SiGe microbolometers must be made as hybrid sensors, where the polycrystalline SiGe microbolometers are integrated into temperature-sensitive readout circuits by multiple-chip-module technology. After the completion of wafer processing, two substrates, one with microbolometer and the other with read-out circuit, are prebonded in a flip-chip aligner. Then, the cavity is evacuated in a reflow oven, and later reflown at around 240° C., resulting in an eutectic solder bond rim sealing which becomes a hermetic micropackage. The disadvantage of the hybrid design is discussed below.

The responsivity of a resistive bolometer is directly proportional to the TCR, and inversely proportional to the thermal conductance associated with the principal heat loss mechanism. Both parameters are important. However, for IR resistive bolometers, values of thermal conductance can range over several orders of magnitude, whereas the range of possible values of TCR is far less. Therefore, the choice of resistive material is really of secondary importance. The primary focus should be on the thermal isolation structure. Thermal isolation is the key to building high-performance thermal detectors.

In a monolithic design approach, responsivity can be maximized by optimizing the design of the "legs" that support, the thermal element, to control the heat flow (heat loss) from the element to the substrate. In the hybrid approach, the heat flow down to the substrate cannot be easily controlled. In considering an array of sensors, thermal spreading of the image becomes an issue, resulting from the non-ideal isolation of each pixel from its neighbor.

As noted above, one advantage to the hybrid approach is that the elements are separately prepared before bump-bonding to the substrate, which eases process compatibility issues. For a polycrystalline SiGe hybrid sensor, there is no restriction on the process temperature for film deposition or annealing. In the monolithic approach, the fabrication processes are restricted by the thermal limitation of the most temperature sensitive part, which is typically the readout circuit. Typically, the temperature limit can be as low as 400° C. to 450° C., to protect the integrity of the metallization wiring.

SiGe is another material that has thermoelectric applications. It has a high figure-of-merit due to its poor thermal conductivity, and reasonably good electrical conductivity when doped. When Si and Ge are formed in a superlattice structure, further reductions in thermal conductivity can be obtained, while maintaining good electrical conductivity. SiGe quantum dot superlattices and SiGe thin-film (quantum well) superlattices are known. There are two characteristics that differentiate SiGe superlattices from bulk SiGe: the existence of many interfaces, and the periodicity in the structure. The reduced thermal conductance of superlattices is mainly due to the structure's effect on phonon transport of these nanostructures, through the anisotropy of the structure, the phonon spectrum change, and the interface scattering.

As noted above, the choice of resistive material is of secondary importance when compared to the thermal isolation structure. Therefore, it can be very advantageous to apply a SiGe superlattice structure to IR thermal imager applications, to minimize the thermal conductance. However, there are several obstacles preventing the use of a SiGe superlattice for thermal sensor applications.

With respect to the monolithic approach, the high temperatures associated with the fabrication of a SiGe superlattice, prevent the superlattice from being integrated with the read-out circuitry on a single substrate. However, in the hybrid approach, the complication of package and chip bonding limit the application of SiGe superlattices to wafer-scale fabrication processes.

In order to fabricate a two-level microbolometer, readout circuits are fabricated on the silicon substrate underneath the thermal sensor element, to maximize the fill factor. The SiGe superlattice structure in the sensor element requires a single-crystal Si substrate to achieve the proper crystallinity, and these high-temperature processes rule out the possibility of fabricating the readout circuits on the same substrate. It is certainly feasible to fabricate Si/Ge superlattice structures on a second wafer, and transfer to the wafer with readout devices. However, difficulties occur after wafer transfer in the removal of the remaining Si from the SiGe superlattice structure. This is a problem, no matter whether the separation is by smart-cut wafer splitting, or by backside grinding and polishing.

To achieve high sensitivity, it is necessary to isolate the thermal element (SiGe superlattice) by generating a cavity under the element. The problem is how to form the cavity without removing the SiGe films.

It would be advantageous if the advantages of both the monolithic and hybrid design approaches could be used to fabricate a thermal sensor with a SiGe superlattice thermal sensing element.

SUMMARY OF THE INVENTION

The present invention thermal sensor includes all the advantages of a monolithic IR thermal sensor made from a SiGe superlattice. To overcome the temperature limitations associated with the monolithic approach, a parallel fabrication process is used. CMOS readout circuitry is fabricated on one Si wafer, while the SiGe superlattice structure is formed on a second wafer, a silicon-on-insulator (SOI) wafer for example. By bonding these wafers together after processing, the temperature sensitivity issues are addressed.

After wafer splitting, a polishing/etching step is used to remove the remaining Si from the superlattice. The oxide in the SOI wafer serves as an etch stop layer. The remaining Si on the second wafer can be removed completely without affecting the SiGe films. The primary (first) wafer with the completed MOS circuits is coated with dielectric layers as passivation. The dielectric structures may be an oxide/nitride/oxide multilayer. The cavities are formed after wafer splitting and etching, by photolithography and etching. The nitride layer serves as an etch stop layer in the cavity formation.

Accordingly, a method is provided for fabricating a silicon/germanium (SiGe) superlattice thermal sensor. The method forms an active complimentary metal oxide semiconductor (CMOS) device in a first Si substrate, and a SiGe superlattice structure on a second Si-on-insulator (SOI) substrate. The first substrate is bonded to the second substrate, forming a bonded substrate. An electrical connection is formed between the SiGe superlattice structure and the CMOS device, and a cavity is formed underlying the SiGe superlattice structure.

In one aspect, the CMOS device is formed in the first Si substrate by fabricating a CMOS device with an electrode overlying a Si substrate, forming a first oxide layer overlying the electrode, forming a first nitride layer overlying the first oxide layer, and forming a second oxide layer overlying the first nitride layer.

In another aspect, the SiGe superlattice structure is formed overlying the second SOI substrate with the SiGe superlattice overlying a top Si layer of a SOI substrate. Then, a Si cap layer is deposited overlying the SiGe superlattice, and optionally, a second nitride layer is deposited over the Si cap layer. Hydrogen ions are implanted to a first level in the SOI substrate, below the SOI oxide insulator layer. Bonding the substrates includes bonding the second nitride layer of the second SOI substrate, to the second oxide layer of the first Si substrate.

Then, the bonded substrate is split along the SOI substrate first level, and an etching is performed from the first level to the SOI oxide insulator.

After conformally depositing and selectively etching an absorbing layer, exposed regions of the SOI oxide insulator are anisotropically etched. Following the formation of the electrical connection, a cavity is formed between the first nitride layer and the second nitride layer, underlying the SiGe superlattice.

Additional details of the above described method and SiGe superlattice thermal sensor are presented below.

BRIEF DESCRIPTION OF THE DRAWINGS

FIG. 1 is a partial cross-sectional view of a silicon/germanium (SiGe) superlattice thermal sensor.

FIG. 2 is a partial cross-sectional view of a first SiGe superlattice structure of FIG. 1.

FIGS. 5 through 21 depict steps in the fabrication of the SiGe superlattice thermal sensor of FIG. 1.

FIGS. 22A and 22B are flowcharts illustrating a method for fabricating a SiGe superlattice thermal sensor.

DETAILED DESCRIPTION

Figure 3:
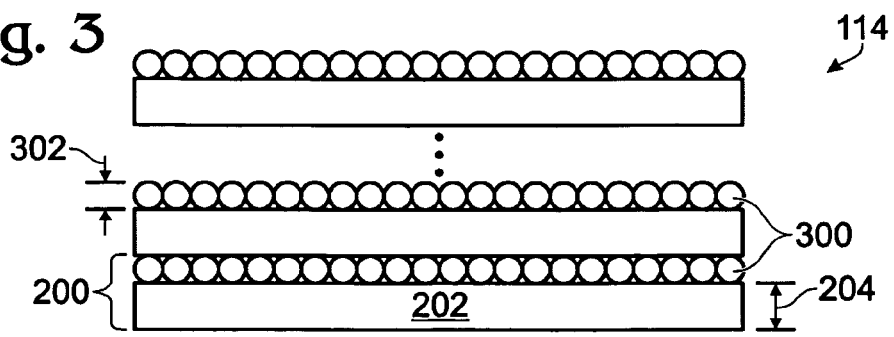
FIG. 3 is a partial cross-sectional view of a second SiGe superlattice structure of FIG. 1.

FIG. 1 is a partial cross-sectional view of a silicon/germanium (SiGe) superlattice thermal sensor. The sensor 100 comprises an active complimentary metal oxide semiconductor (CMOS) device with an electrode 102 formed in a first Si substrate 106. For example, the electrode 102 may be a cathode of a diode (not shown). However in other aspects not shown, the electrode may be associated with a field effect transistor (FET) or a bipolar transistor. Typically, the first substrate 106 is a Si material.

An oxide layer 110 (later defined as the second oxide layer) with a cavity 112 is formed overlying the electrode 102. A SiGe superlattice structure 114 overlies the cavity 112. It should be understood that the SiGe superlattice structure 114 is a single-crystal material. A metal interlevel via connection 116 is formed between the Si/Ge superlattice structure 114 and the CMOS electrode 102. More specifically, the interlevel connection 116 is formed between electrode 102 and top Si layer 118. Top Si layer 118 overlies the SiGe superlattice structure 114, a SI-on-insulator (SOI) oxide insulator 130 overlies top Si layer 118, and a surface absorbing layer 120 overlies the SOI oxide insulator layer 130. For example, the absorbing layer 120 may be a material such as TiN, TaN, Ni, SiNx, or a combination of the above-mentioned layers. However, the sensor is not necessarily limited to just these materials.

For convenience in manufacturing, the oxide layer 110 may be part of an oxide/nitride/oxide stack 122 overlying the CMOS electrode 102, including a first oxide 124, a first nitride 126, and the second oxide 110. The cavity 112 is formed in the second oxide 110. A Si cap layer 128 may be interposed between the second oxide 110 and the SiGe superlattice structure 114. Optionally, a second nitride layer 132 may be interposed between the cavity 112 and the Si cap layer 128.

FIG. 2 is a partial cross-sectional view of a first SiGe superlattice structure 114 of FIG. 1. Typically, the SiGe superlattice structure 114 includes SiGe layers having a number of periods 200 in a range of about 10 to 100. A period is defined herein as a layer of Si adjacent a layer of Ge. In one aspect, each Si layer 202 has a thickness 204 in a range of about 2 nanometers (nm) to 50 nm. Each Ge layer 206 overlying a Si layer 204 has a thickness 208 in a range of about 2 nm to 50 nm.

FIG. 3 is a partial cross-sectional view of a second SiGe superlattice structure 114 of FIG. 1. In this aspect the SiGe superlattice 114 includes Ge quantum dots. As above, the number of periods 200 of Si-to-Ge layers is in range of 10 to 100, and each Si layer 202 has a thickness 204 in the range of about 2 nm to 100 nm. In this aspect however, Ge quantum dots 300 overlie each Si layer 200. The Ge quantum dots have an average diameter 302 in a range of about 2 nm to 100 nm.

Functional Description

Figure 4:
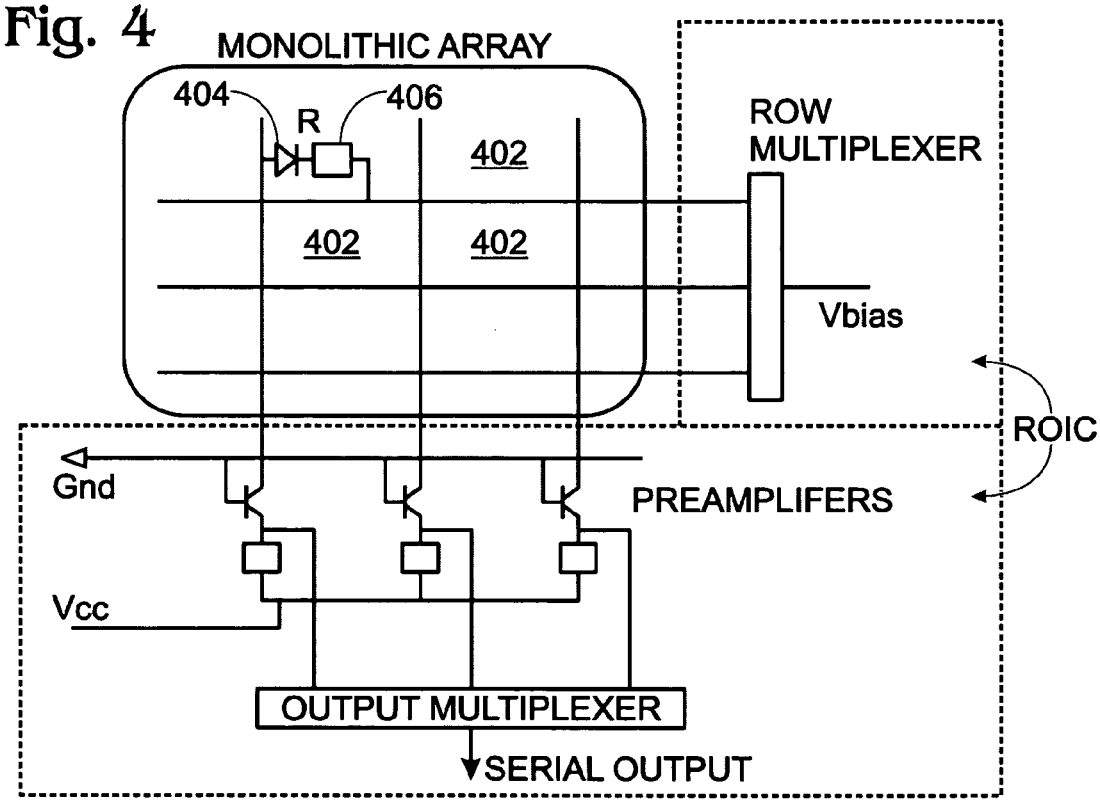
FIG. 4 is a schematic diagram, which is an example depicting an array of thermal sensor pixel elements (prior art).
Figure 5:
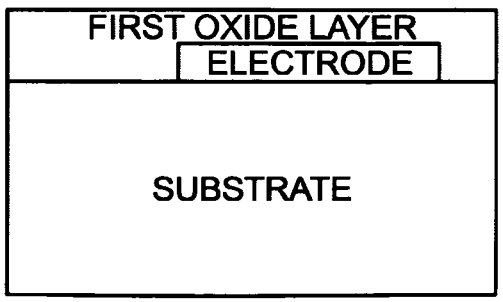
Figure 6:
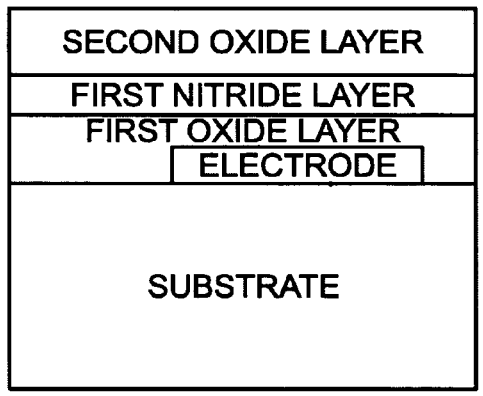
Figure 7:
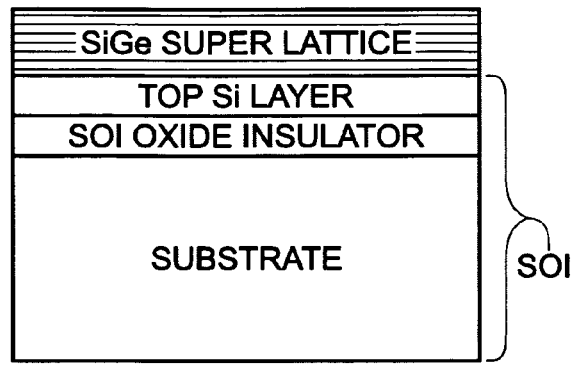
Figure 8:
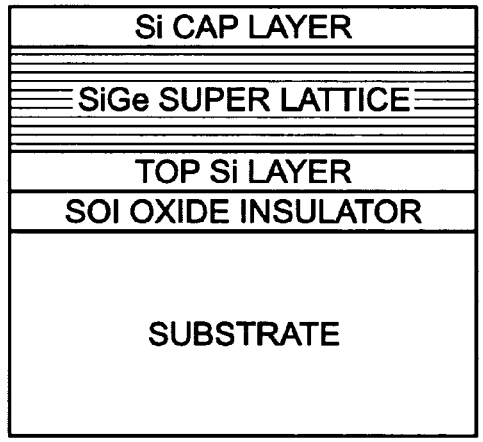
Figure 9:
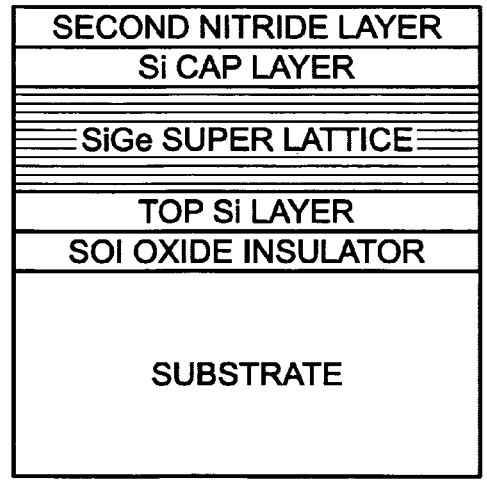
Figure 12:
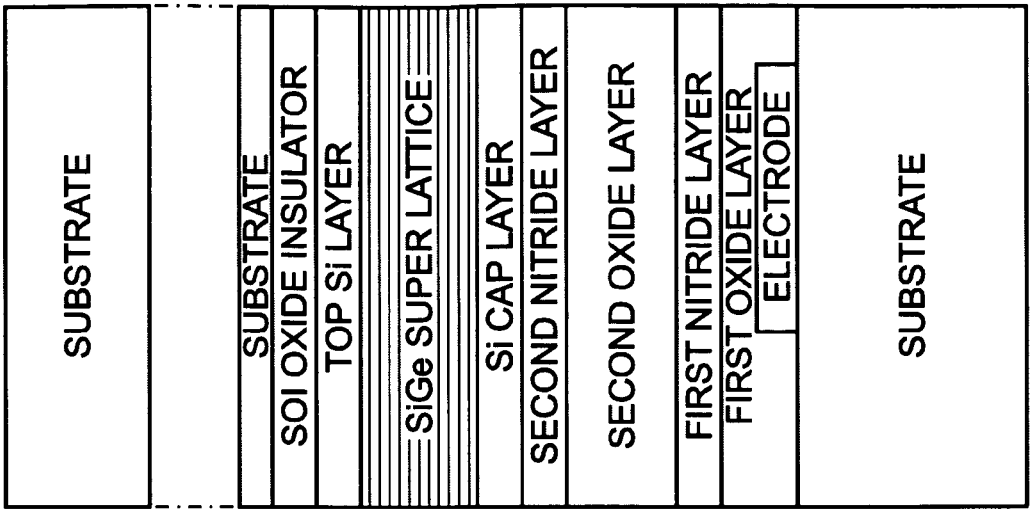
Figure 11:
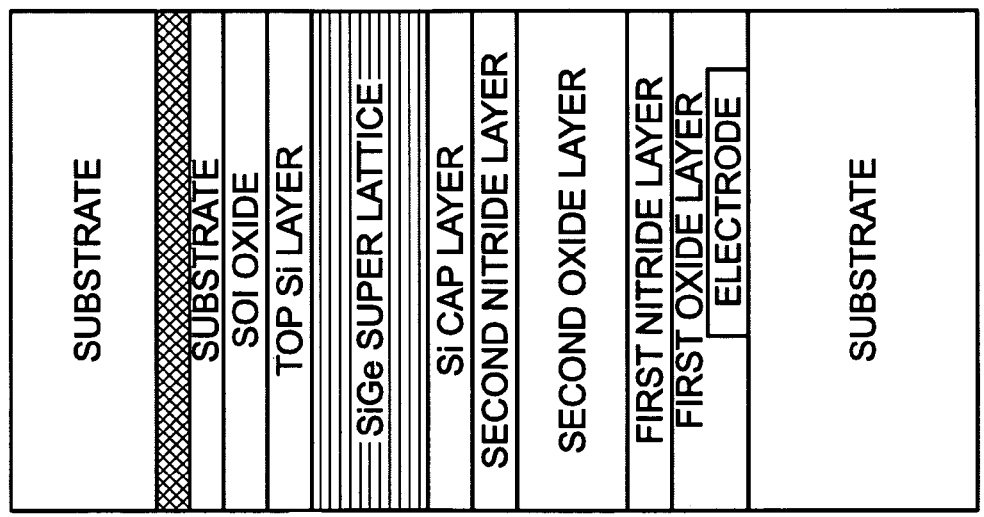
Figure 10:
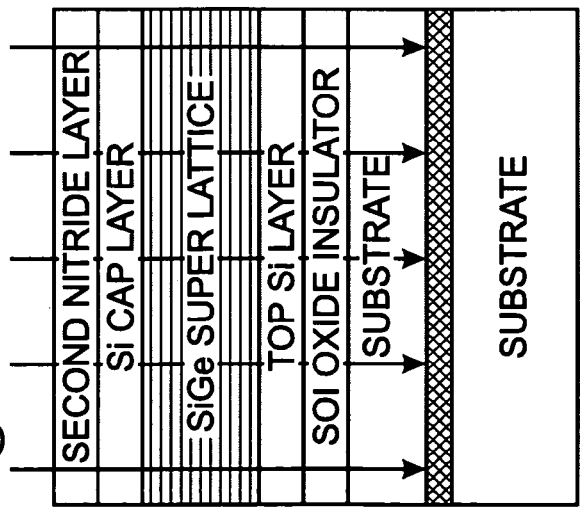
Figure 13:
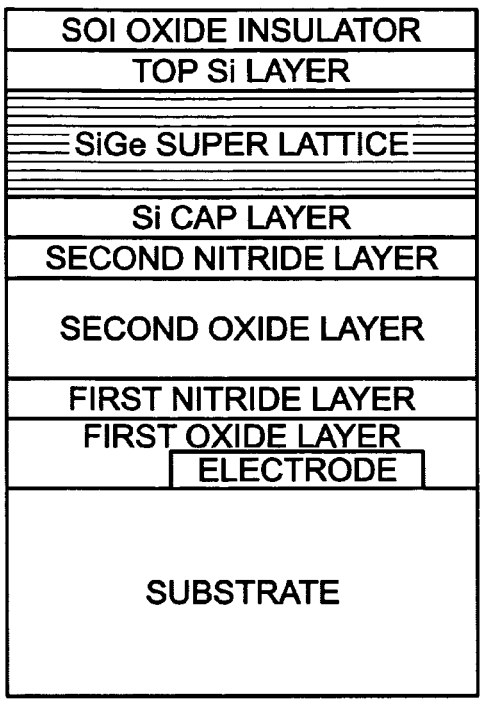
Figure 14:
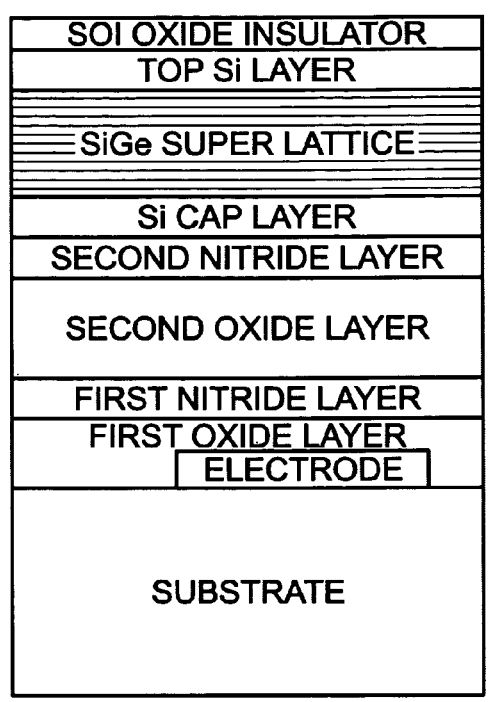
Figure 15:
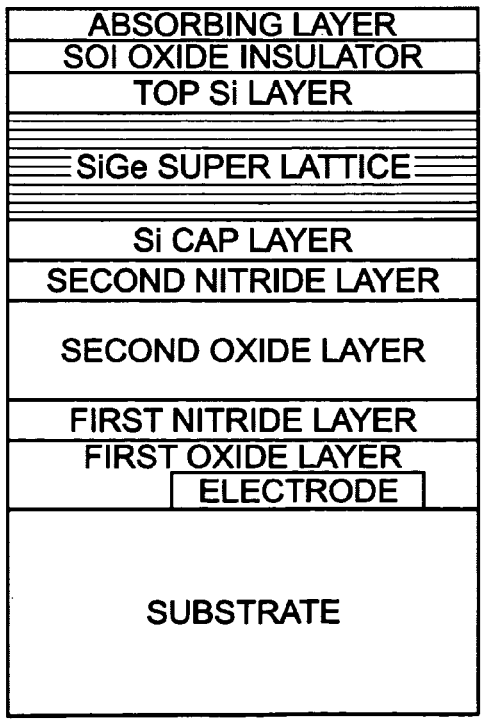
Figure 16:
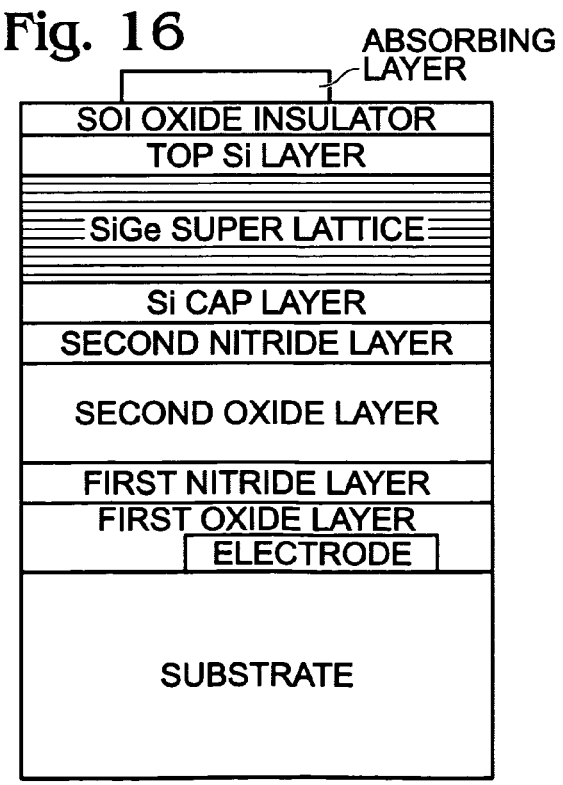

FIG. 4 is a schematic diagram, which is an example depicting an array 400 of thermal sensor pixel elements (prior art). The thermal 6 sensor of FIG. 1 is part of a pixel 402 that includes an active Si device 404 (e.g. a diode) and a bolometer 406 (resistor). The SiGe superlattice of FIG. 1 is a bolometer. Although the active Si device is depicted as a diode, in other aspects (not shown) it may be a FET, bipolar transistor, or transistor circuit. The readout circuit (ROIC) 408 includes active devices for enabling rows and columns of the array 400.

Generally, the CMOS readout circuitry 408 and active Si device 404 are fabricated on one Si wafer, while the Si/Ge superlattice structure is deposited on an SOI wafer. The first wafer with the completed MOS circuits is coated with dielectric layers as passivation. The dielectric layers include an oxide/nitride/oxide multilayer. After wafer bonding, a backside polishing/etching is used to remove the remaining Si. The oxide in the SOI wafer serves as an etch stop layer. The remaining Si on the second wafer can be removed completely without affecting the Si/Ge films.

After deposition of the IR absorber layer, and patterning and etching of the Si/Ge sensing elements, the cavities are formed by photolithographic and etching techniques. The nitride layer serves as etch stop layer in the cavity formation.

FIGS. 5 through 21 depict steps in the fabrication of the SiGe superlattice thermal sensor of FIG. 1. The process steps can be divided into three stages: (1) process steps of the first wafer with completed CMOS circuitry, (2) process steps of the second wafer with Si/Ge superlattice structure, and (3) wafer bonding and post-bonding process steps.

The Stage 1 process steps are as follows:

1. After completion of CMOS processing, coat circuitry with TEOS or plasma oxide, and planarize the surface by chemical mechanical polishing, see FIG. 5. Here, a single electrode is shown, which represents either the active Si device or ROIC circuitry shown in FIG. 4.

2. Deposit a nitride as an etch stop layer, which is covered by another layer of TEOS or plasma oxide, see FIG. 6.

The Stage 2 SiGe superlattice structure process steps are as follows:

1. After a proper surface cleaning, load the SOI wafer into SiGe deposition system, which can be molecular beam epitaxy (MBE), chemical vapor deposition (CVD), or plasma CVD system. Deposit a SiGe superlattice structure, or SiGe superlattice with Ge quantum dots. In the case of Ge quantum dots, preferably the quantum dots are not self-aligned, to reduce the surface roughness caused by the accumulating height of the Ge dots. This result can be achieved by adjusting the thickness of Si layer. The Si and Ge layers can be properly doped to achieve the required thermal and electrical properties, see FIG. 7.

2. Deposit an undoped Si cap layer at the end of the process. If needed, a chemical-mechanical polish (CMP) process can be used to smooth the surface for a better wafer bonding result, see FIG. 8.

3. As an option, deposit a SiNx layer, which serves to support the SiGe structure after etching out the cavities for thermal isolation, see FIG. 9.

4. Implant hydrogen for wafer splitting. The range of hydrogen is targeted for below the buried oxide layer. The purpose is to use this oxide layer as an etch stop layer when the remaining Si is to be removed, see FIG. 10.

The steps for the Stage 3 wafer bonding processes are as follows:

1. After a proper surface treatment in dilute SC-1 solution to make the surface hydrophilic, bond the two wafers together by direct wafer bonding technique, see FIG. 11.

2. To cause wafer splitting, anneal the bonded wafers in an annealing furnace at temperature below the alloying temperature for the CMOS metallization, in most cases below 400°-450 C., for 30 min to 1 hour, see FIG. 12.

3. Remove the remaining Si on the device wafer with bonded SiGe superlattice structure using proper polishing/etching step. The buried oxide transferred from SOI wafer serves an etch stop to protect the Si/Ge layered structure, see FIG. 13.

4. After complete removal of the remaining Si from the wafer (as described in Step 3), etch and remove part of the buried oxide layer (BOX), leaving part of the BOX as an etch stop and for electrical isolation from the surface IR absorbing layer, see FIG. 14.

5. Depositing a surface absorbing layer, for example, TiN, TaN, thin Ni, or SiNx, or combination of these layers, see FIG. 15.

6. Pattern and etch the absorbing layer and the oxide layer, see FIG. 16.

7. Pattern and etch the SiGe superlattice structure. Etch nitride if the optional SiNx layer as been deposited (as described in Stage 2, Step 3), see FIG. 17.

8. Pattern and etch the contact holes. Deposit metallization layer to connect the CMOS ROIC to the SiGe structure, see FIG. 18.

9. Pattern and etch to form cavities under the SiGe thermal sensing element, see FIG. 19.

Figure 20:
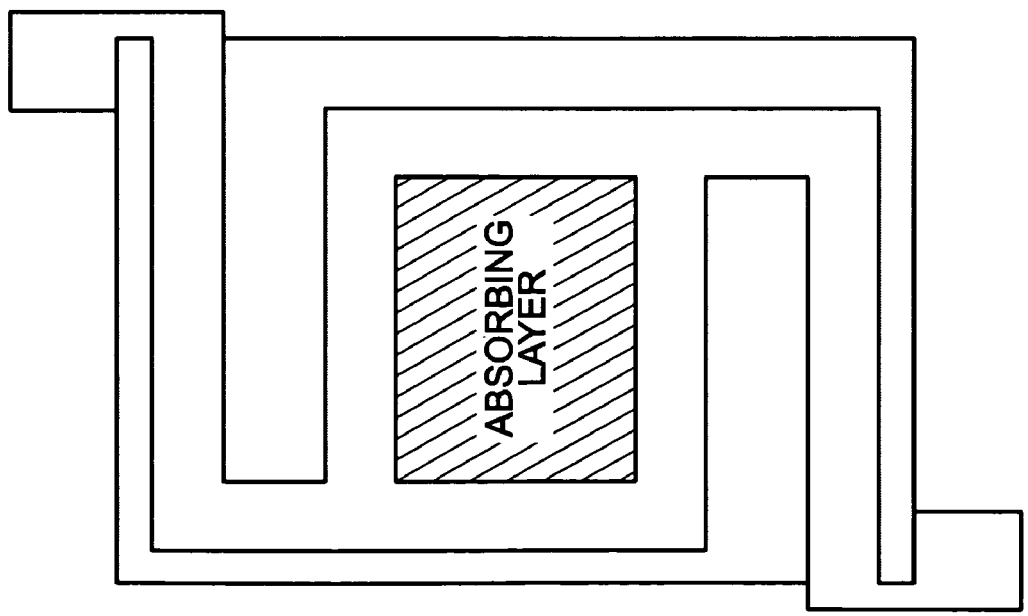

FIG. 20 is a plan view showing the SiGe sensing element and absorbing layer.

Figure 21:
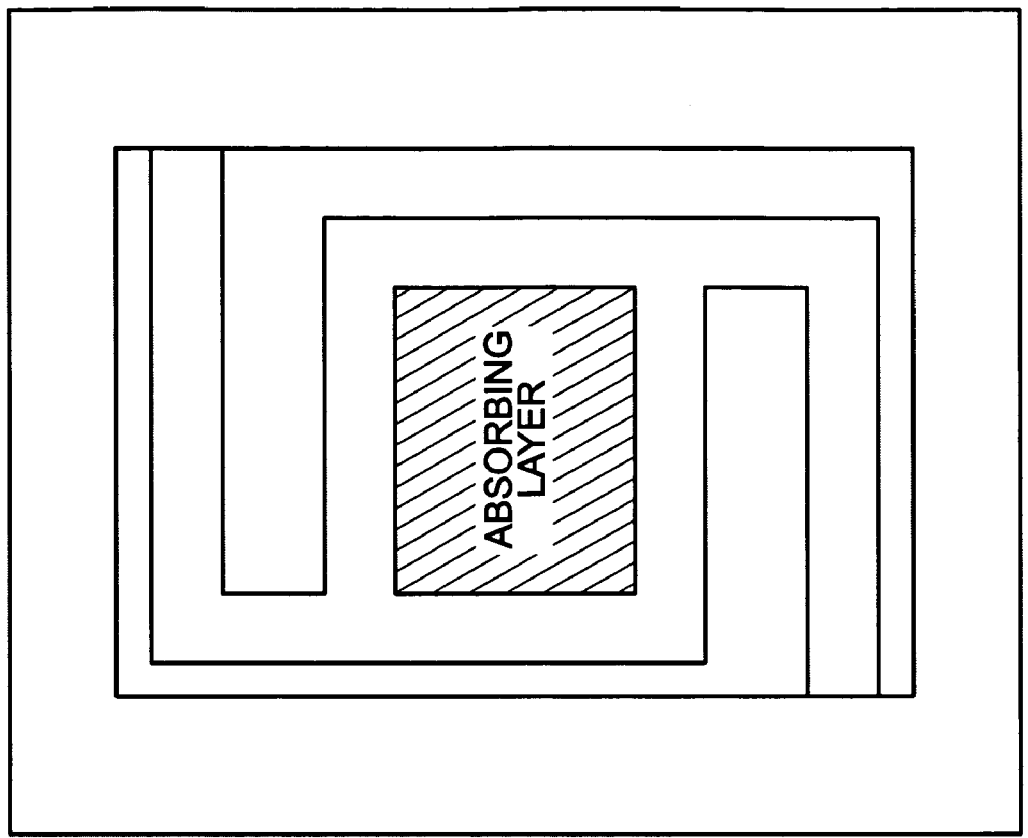

FIG. 21 depicts the resist pattern used to form cavities under the SiGe thermal sensor. Vacuum packaging maximizes the thermal isolation of the sensor. The window on the package follows conventional process technology.

Figure 22B:
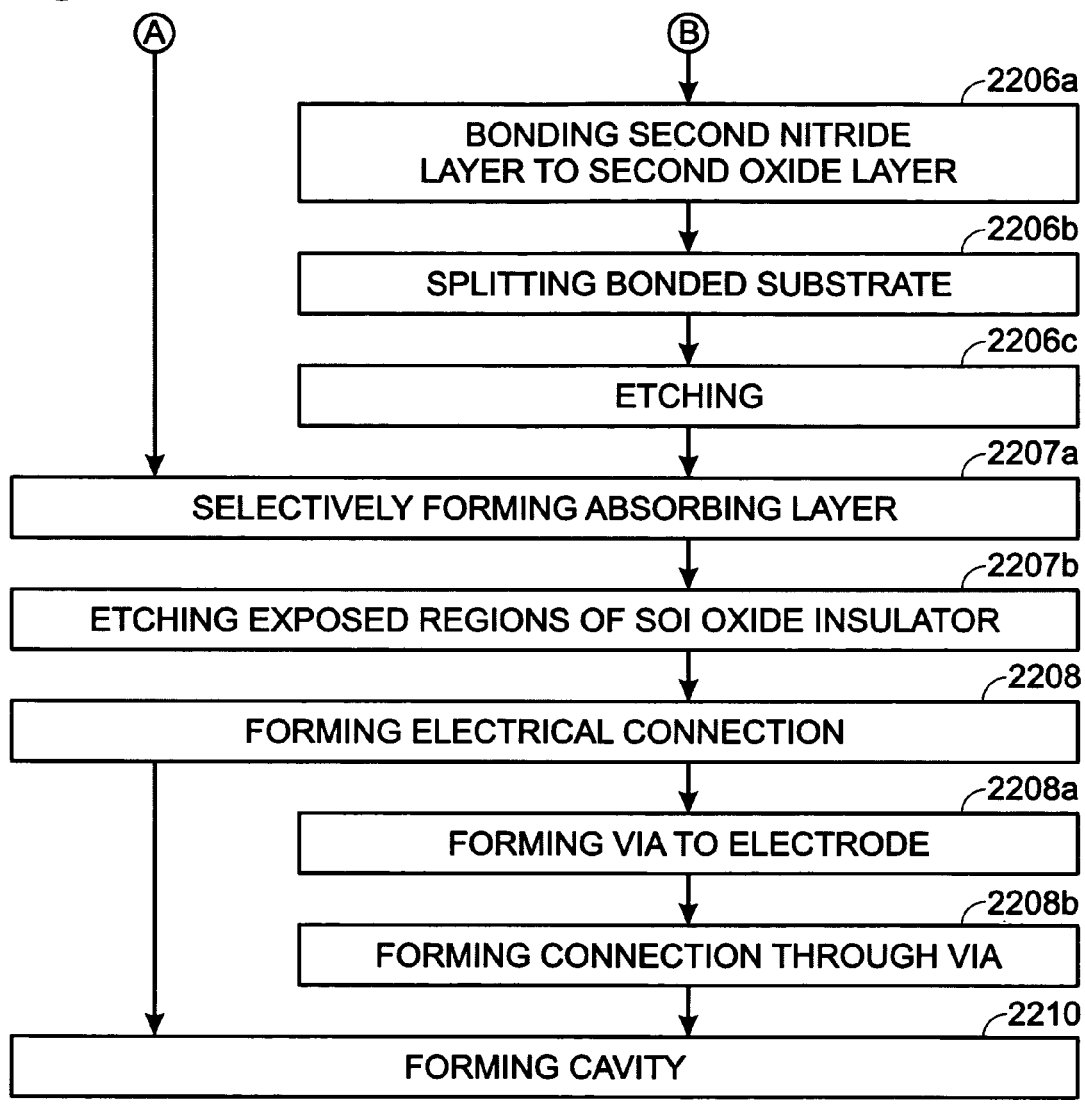

FIGS. 22A and 22B are flowcharts illustrating a method for fabricating a SiGe superlattice thermal sensor. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 2200.

Step 2202 forms an active complimentary metal oxide semiconductor (CMOS) device in a first Si substrate. Step 2204 forms a SiGe superlattice structure on a second Si-on-insulator (SOI) substrate. Step 2206 bonds the first substrate to the second substrate, forming a bonded substrate. Step 2208 forms an electrical connection between the SiGe superlattice structure and the CMOS device. Step 2210 forms a cavity between the SiGe superlattice structure and the bonded substrate.

In one aspect, forming the CMOS device in the first Si substrate includes substeps. Step 2202a forms a CMOS device with an electrode overlying a Si substrate. Step 2202b forms a first oxide layer overlying the electrode. Step 2202c forms a first nitride layer overlying the first oxide layer, and Step 2202d forms a second oxide layer overlying the first nitride layer.

In another aspect, forming the SiGe superlattice structure overlying the second SOI substrate in 2204 includes substeps. Step 2204a forms a SiGe superlattice overlying a top Si layer of a SOI substrate. Step 2204b deposits a Si cap layer overlying the SiGe superlattice, and optionally, Step 2204c forms a second nitride layer overlying the Si cap layer. Step 2204d implants hydrogen ions to a first level in the SOI substrate, below the SOI oxide insulator layer.

In a different aspect, forming the SiGe superlattice in Step 2204 includes forming a SiGe superlattice with Ge quantum dots. For example, the SiGe superlattice with quantum dots may include Si layers having a thickness in a range of about 2 nanometers (nm) to 100 nm, and Ge quantum dots overlying the Si layers, having a diameter in a range of about 2 nm to 100 nm. The superlattice is formed with a number of periods of SiGe layers in a range of about 10 to 100. Alternately, the SiGe superlattice may include Si layers having a thickness in a range of about 2 nm to 50 nm, and Ge layers overlying the Si layers, having a thickness in a range of about 2 nm to 50 nm. Again, the superlattice is formed with a number of periods of SiGe layers in a range of about 10 to 100.

In one aspect, forming the bonded substrate in Step 2206 includes substeps. Step 2206a bonds the second nitride layer of the second SOI substrate to the second oxide layer of the first Si substrate. Step 2206b splits the bonded substrate along the SOI substrate first level, and Step 2206c etches from the first level to the SOI oxide insulator.

In one aspect, Step 2207a selectively forms an absorbing layer overlying a region of the SOI oxide insulator, by conformally depositing the absorbing layer, followed by a patterned etch. For example, the absorbing layer may be TiN, TaN, Ni, SiNx, or a combination of the above-mentioned layers. Step 2207b anisotropically etches exposed regions of the SOI oxide insulator, down to the top Si layer. Forming the electrical connection in Step 2208 may include substeps. Step 2208a forms a via through an exposed region of the second oxide layer, down to the electrode. Step 2208b forms an electrical interconnection from the electrode, through the via, to the Si top layer. Forming the cavity between the SiGe superlattice structure and the bonded substrate (Step 2210) includes forming a cavity between the first nitride layer and the Si cap layer, underlying the SiGe superlattice.

A SiGe superlattice thermal sensor and corresponding fabrication process have been presented. Details of materials and explicitly process steps have been given as examples to illustrate the invention. However, the invention is not limited to merely these examples. Other variations and embodiments of the invention will occur to those skilled in the art.

We claim:

1. A silicon germanium (SiGe) superlattice thermal sensor, the sensor comprising:
    an active complimentary metal oxide semiconductor (CMOS) device with an electrode formed in a first Si substrate;
    an oxide layer with a cavity formed overlying the electrode;
    a SiGe superlattice structure overlying the cavity;
    a metal interlevel via connection between the Sige superlattice structure and the CMOS electrode;
    a top Si layer overlying the SiGe superlattice structure;
    a silicon-on-insulator (SOI) oxide insulator overlying the top Si layer; and,
    a surface absorbing layer overlying the SOI oxide insulator.

2. The sensor of claim 1 further comprising:
    a first oxide/first nitride/second oxide stack overlying the CMOS electrode; and,
    wherein the cavity is formed in the second oxide.

3. The sensor of claim 1 wherein the SiGe superlattice includes Ge quantum dots.

4. The sensor of claim 1 wherein the absorbing layer is a material selected from a group consisting of TiN, TaN, Ni, SiNx, and a combination of the above-mentioned layers.

5. The sensor of claim 1 wherein the SiGe superlattice structure includes SiGe layers having a number of periods in a range of about 10 to 100.

6. The sensor of claim 2 further comprising:
    a Si cap layer interposed between the second oxide and the SiGe superlattice structure.

7. The sensor of claim 6 further comprising:
    a second nitride layer interposed between the cavity and the Si cap layer.

8. The sensor of claim 5 wherein the SiGe superlattice includes:
    Si layers having a thickness in a range of about 2 nanometers (nm) to 100 nm; and,
    Ge quantum dots overlying the Si layers, having a diameter in a range of about 2 nm to 100 nm.

9. The sensor of claim 5 wherein the SiGe superlattice includes:
    Si layers having a thickness in a range of about 2 nm to 50 nm; and,
    Ge layers overlying the Si layers, having a thickness in a range of about 2 nm to 50 nm.

* * * * *